United States Patent
Atzmon

(10) Patent No.: US 7,852,670 B2
(45) Date of Patent: Dec. 14, 2010

(54) METHOD FOR INCREASING STORAGE CAPACITY OF A MEMORY DEVICE

(75) Inventor: Elisha Atzmon, Tel-Aviv (IL)

(73) Assignee: Megamem Ltd., Herzliya (IL)

( * ) Notice: Subject to any disclaimer, the term of this patent is extended or adjusted under 35 U.S.C. 154(b) by 147 days.

(21) Appl. No.: 12/065,838

(22) PCT Filed: Sep. 5, 2005

(86) PCT No.: PCT/IL2005/000939

§ 371 (c)(1),
(2), (4) Date: Mar. 5, 2008

(87) PCT Pub. No.: WO2007/029223

PCT Pub. Date: May 15, 2007

(65) Prior Publication Data

US 2008/0209113 A1    Aug. 28, 2008

(51) Int. Cl.
*G11C 16/04* (2006.01)

(52) U.S. Cl. .......................... 365/185.03; 365/189.011; 365/189.07

(58) Field of Classification Search ............ 365/185.03, 365/168, 189.01, 189.07, 189.09, 230.06, 365/189.011

See application file for complete search history.

(56) References Cited

U.S. PATENT DOCUMENTS

| 5,432,735 | A |   | 7/1995  | Parks et al. |
|-----------|---|---|---------|--------------|
| 5,764,571 | A | * | 6/1998  | Banks ............... 365/189.07 |
| 5,825,685 | A |   | 10/1998 | Yamane et al. |
| 6,351,429 | B1| * | 2/2002  | Hsu et al. ............. 365/230.06 |
| 6,639,825 | B2| * | 10/2003 | Feurle et al. ............ 365/149 |
| 6,724,656 | B2| * | 4/2004  | Banks ............... 365/185.01 |
| 2002/0167832 | A1 | | 11/2002 | Feurle et al. |

OTHER PUBLICATIONS

G. Atwood, et al., "Intel FlashStrata Memory Technology Overview", Intel Technology Journal, Q4'97, 1997, p. 1-8.

* cited by examiner

*Primary Examiner*—Gene N Auduong
(74) *Attorney, Agent, or Firm*—Browdy and Neimark, PLLC

(57) ABSTRACT

A method for increasing memory storage capacity in a memory device having at least two storage cells wherein at least one measurable physical property is associated with each of the storage cells a nominal value of which may be used to assign a data value to the respective storage cell. Differences between at least two storage cells with regard to the respective nominal values of one or more of the respective physical properties associated with a storage cell and its actual value at a given time are used to provide additional storage capacity.

37 Claims, 1 Drawing Sheet

METHOD FOR INCREASING STORAGE CAPACITY OF A MEMORY DEVICE

FIELD OF THE INVENTION

This invention relates to memory devices.

BACKGROUND OF THE INVENTION

A data storage (memory) circuit is a circuit that enables keeping/holding a certain amount of information within a physical place (cell), with the ability of later extraction/reading of the information. Moreover, one can generalize the above definition by treating the memory as an information container in physical space-time (rather than in physical space only). Then, it is more natural to understand some of the physical processes involved in data storage. The time dimension differs between some of the features of different types of memory circuits.

Information, in its modern understanding was realized in the first half of the $20^{th}$ century, by the pioneering works of Nyquist & Shennon. The deep understanding of the relation to physics is the foundation of modern information & communication theory. Nyquist was the first one to understand the sampling issue, while Shannon was the first one to understand the relation of information to the physical term—"entropy" (that was realized first by Boltzmann at the end of the $19^{th}$ century).

Conventionally, memory devices are digital circuits that stores data digitally in binary form. The number of cells in the memory device determines the number (n) of bits that can be stored in such a memory. The number of bits determines the number (S) of states that can be stored such that $n=\log_2 S$.

It emerges from the above that every additional bit doubles the number of states, i.e. the capacity of the memory device. In the ever increasing drive to increase the storage capacity of memory devices, much effort has been invested in making the circuits themselves more compact and to improving methods of mass production. This has resulted in a dramatic increase in the performance/cost ratio of memory devices in recent years.

However, since the number of states of the memory (i.e. its storage capacity) is determined by the number of bits (i.e. cells in a digital memory), the storage capacities of known memory devices are limited by the number of cells. It is clearly desirable to increase the storage capacity of a memory without adding storage cells.

This desideratum is known per se. Thus, it is known to increase the density of flash memories using Multi-Level-Cell (M.L.C.) technology. This technology lowers the cost by enabling the storage of multiple bits of data per memory cell thereby reducing the consumption of silicon area. This technology is used by various manufacturers of flash memory such as the Intel StrataFlash memory as described by Greg Atwood et al. in the Intel Technology Journal Q4, 1997. As described therein, a flash memory device is a single transistor that includes an isolated floating gate. The floating gate is capable of storing electrons. The behavior of the transistor is altered depending on the amount of charge stored on the floating gate. Charge is placed on the floating gate through a technique called programming. The programming operation generates hot electrons in the channel region of the memory cell transistor. A fraction of these hot electrons gain enough energy to surmount the 3.2 eV barrier of the Si—$SiO_2$ interface and become trapped on the floating gate. For single bit per cell devices, the transistor either has little charge (<5,000 electrons) on the floating gate and thus stores a "1" or it has a lot of charge (>30,000 electrons) on the floating gate and thus stores a "0." When the memory cell is read, the presence or absence of charge is determined by sensing the change in the behavior of the memory transistor due to the stored charge. The stored charge is manifested as a change in the threshold voltage of the memory cell transistor.

It is thus known to compare a physical property associated with a memory cell with an external reference in order to associate multiple states with a single memory cell. It would be desirable to provide a method for increasing the storage capacity of a memory device having a given number of memory cells and a given number of levels of a physically limited external reference.

SUMMARY OF THE INVENTION

It is therefore a principal object of the invention to increase the storage capacity of a memory device having a given number of memory cells and a given number of levels of a physically limited external reference.

It is a further object of the invention to provide a method of increasing the number of states, so as to increase the number of bits within a memory chip but without increasing the number of memory cells and without the need to employ an extra external reference state as is done in MLC where the external reference serves to define the actual logic value to be associated with each storage cell.

These objects are realized in accordance with an aspect of the invention by a method for increasing storage capacity of a predetermined number of storage cells in a memory device having at least two storage cells, the method comprising:
 (a) associating with each of the storage cells at least one measurable physical property whose nominal value may be used to assign a data value to the respective storage cell; and
 (b) using differences between the respective nominal values of one or more of the respective physical properties associated with a storage cell and its actual value at a given time to provide additional storage capacity.

In accordance with such a method, the number of physical states within a system of memory cells is increased based on inter-relations between cells. Such a method can be integrated with all other methods implemented to further increase the number of bits per given number of physical memory cells.

BRIEF DESCRIPTION OF THE DRAWINGS

In order to understand the invention and to see how it may be carried out in practice, various embodiments will now be described, by way of non-limiting examples only, with reference to the accompanying drawings, in which.

Figure 1:
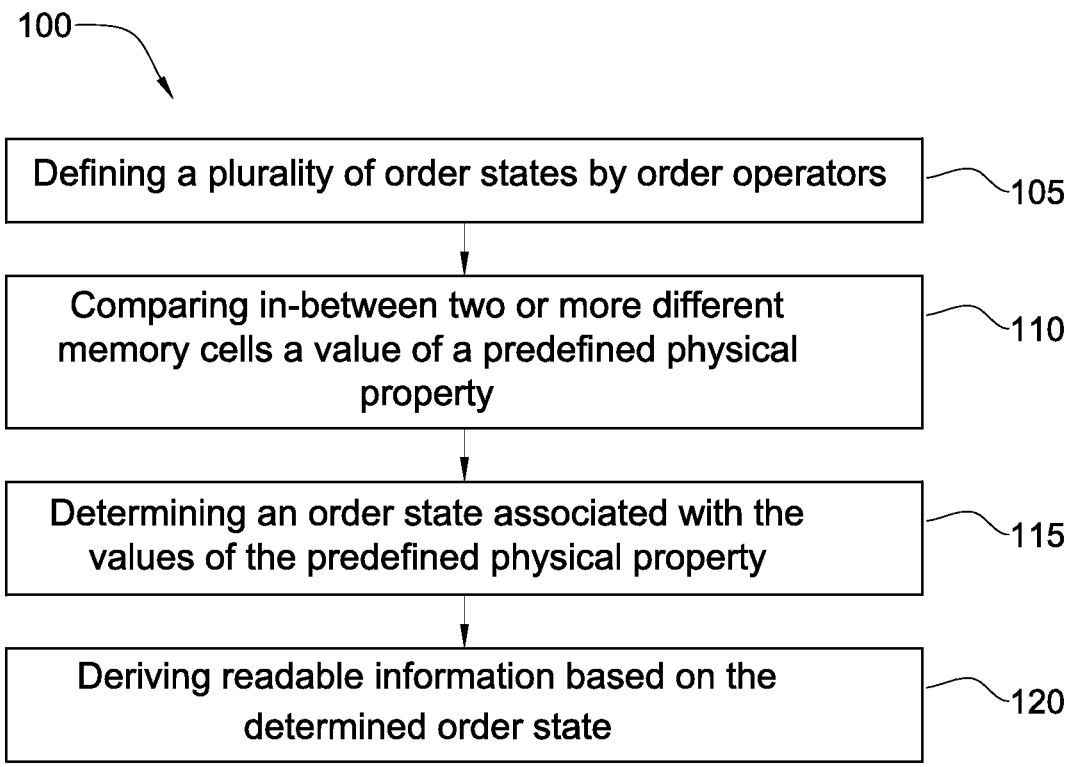
FIG. 1 is a schematic a flow-chart 100 of a method for retrieving data from two or more memory cells, according to an embodiment of the present invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF AN EXEMPLARY EMBODIMENT

Fundamental Principles

We start our explanation with the simplest example—two physical cells and a defined observable order in which data is written to the cells. Thus, two bits and an order provide states as shown in Table I below:

TABLE I

| Order | State 1 | |
|---|---|---|
| 2 | | |
| 1 | 0 | 0 |
| | Bit1 | Bit2 |

| Order | State 2 | |
|---|---|---|
| 2 | | 0 |
| 1 | 0 | |
| | Bit1 | Bit2 |

| Order | State 3 | |
|---|---|---|
| 2 | 0 | |
| 1 | | 0 |
| | Bit1 | Bit2 |

| Order | State 4 | |
|---|---|---|
| 2 | 0 | 0 |
| 1 | | |
| | Bit1 | Bit2 |

| Order | State 5 | |
|---|---|---|
| 2 | | |
| 1 | 0 | 1 |
| | Bit1 | Bit2 |

| Order | State 6 | |
|---|---|---|
| 2 | | 1 |
| 1 | 0 | |
| | Bit1 | Bit2 |

| Order | State 7 | |
|---|---|---|
| 2 | 0 | |
| 1 | | 1 |
| | Bit1 | Bit2 |

| Order | State 8 | |
|---|---|---|
| 2 | 0 | 1 |
| 1 | | |
| | Bit1 | Bit2 |

| Order | State 9 | |
|---|---|---|
| 2 | | |
| 1 | 1 | 0 |
| | Bit1 | Bit2 |

| order | State 10 | |
|---|---|---|
| 2 | | 0 |
| 1 | 1 | |
| | Bit1 | Bit2 |

TABLE I-continued

| order | State 11 | |
|---|---|---|
| 2 | 1 | |
| 1 | | 0 |
| | Bit1 | Bit2 |

| Order | State 12 | |
|---|---|---|
| 2 | 1 | 0 |
| 1 | | |
| | Bit1 | Bit2 |

| Order | State 13 | |
|---|---|---|
| 2 | | |
| 1 | 1 | 1 |
| | Bit1 | Bit2 |

| Order | State 14 | |
|---|---|---|
| 2 | | 1 |
| 1 | 1 | |
| | Bit1 | Bit2 |

| Order | State 15 | |
|---|---|---|
| 2 | 1 | |
| 1 | | 1 |
| | Bit1 | Bit2 |

| Order | State 16 | |
|---|---|---|
| 2 | 1 | 1 |
| 1 | | |
| | Bit1 | Bit2 |

Within the above 16 states (e.g., as defined at step 105 in FIG. 1; and as defined at step 205 in FIG. 2), equal ordered states (EOS) permitted. In the case that only non-equal ordered states (NEOS) allowed, only 8 states exist (i.e. only states no. 2, 3, 6, 7, 10, 11, 14, 15).

Yet, another option for 8-Selection (e.g., at step 210 in FIG. 2) of "type-2" is the states: 1, 2, 3, 5, 9, 13, 14, 15. In "type-2" selection, the order plays a role, if and only if the two bits are equal and of different order.

So in the EOS case, the 16 states are equivalent to 4 Bits (i.e. $2^4$ states), while in the NEOS case and the "type-2" selection one gets 3 Bits (i.e. $8=2^3$ states).

The key issue demonstrated in the above example is that by associating a defined observable order of writing data to two physical bits provides two extra bits in the EOS case and one extra Bit in the NEOS case or in the "type-2" case.

Consider now the situation of three physical bits and an observable Order. We will make use of the following acronyms: Or—order, St—States, B—Physical Bit.

Table II below there are the 27 states (e.g., as defined at step 105 in FIG. 1; and as defined at step 205 in FIG. 2) of the (0, 0, 0) combination due to 3-Order.

TABLE II

| Or | St 1 | | |
|---|---|---|---|
| 3 | | | |
| 2 | | | |
| 1 | 0 | 0 | 0 |
| | B1 | B2 | B3 |

TABLE II-continued

| Or | B1 | B2 | B3 |
|---|---|---|---|
| St 2 | | | |
| 3 | | | |
| 2 | | | 0 |
| 1 | 0 | 0 | |

| Or | B1 | B2 | B3 |
|---|---|---|---|
| St 3 | | | |
| 3 | | | 0 |
| 2 | | | |
| 1 | 0 | 0 | |

| Or | B1 | B2 | B3 |
|---|---|---|---|
| St 4 | | | |
| 3 | | | |
| 2 | | 0 | |
| 1 | 0 | | 0 |

| Or | B1 | B2 | B3 |
|---|---|---|---|
| St 5 | | | |
| 3 | | | |
| 2 | | 0 | 0 |
| 1 | 0 | | |

| Or | B1 | B2 | B3 |
|---|---|---|---|
| St 6 | | | |
| 3 | | | 0 |
| 2 | | 0 | |
| 1 | 0 | | |

| Or | B1 | B2 | B3 |
|---|---|---|---|
| St 7 | | | |
| 3 | | 0 | |
| 2 | | | |
| 1 | 0 | | 0 |

| Or | B1 | B2 | B3 |
|---|---|---|---|
| St 8 | | | |
| 3 | | 0 | |
| 2 | | | 0 |
| 1 | 0 | | |

| Or | B1 | B2 | B3 |
|---|---|---|---|
| St 9 | | | |
| 3 | | 0 | 0 |
| 2 | | | |
| 1 | 0 | | |

| Or | B1 | B2 | B3 |
|---|---|---|---|
| St 10 | | | |
| 3 | | | |
| 2 | 0 | | |
| 1 | | 0 | 0 |

| Or | B1 | B2 | B3 |
|---|---|---|---|
| St 11 | | | |
| 3 | | | |
| 2 | 0 | | 0 |
| 1 | | 0 | |

| Or | B1 | B2 | B3 |
|---|---|---|---|
| St 12 | | | |
| 3 | | | 0 |
| 2 | 0 | | |
| 1 | | 0 | |

| Or | B1 | B2 | B3 |
|---|---|---|---|
| St 13 | | | |
| 3 | | | |
| 2 | 0 | 0 | |
| 1 | | | 0 |

| Or | B1 | B2 | B3 |
|---|---|---|---|
| St 14 | | | |
| 3 | | | |
| 2 | 0 | 0 | 0 |
| 1 | | | |

| Or | B1 | B2 | B3 |
|---|---|---|---|
| St 15 | | | |
| 3 | | | 0 |
| 2 | 0 | 0 | |
| 1 | | | |

| Or | B1 | B2 | B3 |
|---|---|---|---|
| St 16 | | | |
| 3 | | 0 | |
| 2 | 0 | | |
| 1 | | | 0 |

| Or | B1 | B2 | B3 |
|---|---|---|---|
| St 17 | | | |
| 3 | | 0 | |
| 2 | 0 | | 0 |
| 1 | | | |

| Or | B1 | B2 | B3 |
|---|---|---|---|
| St 18 | | | |
| 3 | | 0 | 0 |
| 2 | 0 | | |
| 1 | | | |

| Or | B1 | B2 | B3 |
|---|---|---|---|
| St 19 | | | |
| 3 | 0 | | |
| 2 | | | |
| 1 | | 0 | 0 |

| Or | B1 | B2 | B3 |
|---|---|---|---|
| St 20 | | | |
| 3 | 0 | | |
| 2 | | | 0 |
| 1 | | 0 | |

| Or | B1 | B2 | B3 |
|---|---|---|---|
| St 21 | | | |
| 3 | 0 | | 0 |
| 2 | | | |
| 1 | | 0 | |

TABLE II-continued

| Or | St 22 | | |
|---|---|---|---|
| 3 | 0 | | |
| 2 | | 0 | |
| 1 | | | 0 |
| | B1 | B2 | B3 |

| Or | St 23 | | |
|---|---|---|---|
| 3 | 0 | | |
| 2 | | 0 | 0 |
| 1 | | | |
| | B1 | B2 | B3 |

| Or | St 24 | | |
|---|---|---|---|
| 3 | 0 | | 0 |
| 2 | | 0 | |
| 1 | | | |
| | B1 | B2 | B3 |

| Or | St 25 | | |
|---|---|---|---|
| 3 | 0 | 0 | |
| 2 | | | |
| 1 | | | 0 |
| | B1 | B2 | B3 |

| Or | St 26 | | |
|---|---|---|---|
| 3 | 0 | 0 | |
| 2 | | | 0 |
| 1 | | | |
| | B1 | B2 | B3 |

| Or | St 27 | | |
|---|---|---|---|
| 3 | 0 | 0 | 0 |
| 2 | | | |
| 1 | | | |
| | B1 | B2 | B3 |

Since, there are originally 8 states in the 3 Physical Bits (000,001,010,011,100,101,110,111) then taking in account the 3-Order, one gets:

For the EOS case the number of states is $2^3 \times 3^3 = 8 \times 27 = 216$ states $\approx 2^{7.755}$ That is more than 7 Bits and less than 8 Bits.

For the NEOS case the number of states is $2^3 \times 3! = 8 \times 6 = 48$ states $\approx 2^{5.585}$ That is more than 5 Bits and less than 6 Bits.

As a rule the total number of states for N Physical Bits and N-Order is:

For the EOS case—$2^N \times N^N$
For the NEOS case—$2^N \times N!$

The first few cases are summarized in Table III below:

TABLE III

| N | EOS Bits | NEOS Bits |
|---|---|---|
| 2 | 4 | 3 |
| 3 | 7.754888 | 5.584963 |
| 4 | 12 | 8.584963 |
| 5 | 16.60964 | 11.90689 |
| 6 | 21.50978 | 15.49185 |
| 7 | 26.65148 | 19.29921 |
| 8 | 32 | 23.29921 |

Remark: Without losing the generality, the Order can be of different number than the number of bits.

Order

It is to be noted that although "order" is used in the above examples to show how additional information may be associated with a pair of bits so as to thereby increase the storage capacity, this is merely to demonstrate the concept of the invention. In practice, the order of writing data need not be (and generally is not) determined and instead there may be associated with different cells a measurable physical property whose value is dependent on the order in which the data is written, although the order is not required explicitly. It thus emerges that no physical clock is provided for associating time associated with physical properties: rather time may be inferred from the measurement of physical properties whose values are time-dependent. Moreover, although in the specific examples provided, the term "order" has been given temporal significance (i.e. is defined by the time sequence in which data is written), this also is by way of example only. In practice, there may be used any ordered parameter in connection with which it is possible to apply comparison operators such as '<', '>', '=', '≠', '≈', '≦', '≧' and so on, at step 110 in FIG. 1, and providing that the application of these operators on the respective properties between cells yields the same results.

Yet another consideration is that, in practice, data need not actually be written in a time-dependent order in order to extend the storage capacity of the memory device providing that the measured physical properties of different cells within the device are different and that the difference may be construed as a difference in the temporal order in which data was written to the cells. For example, DDR (Double Data Rate) memory uses SDRAM i.e. Synchronous Dynamic RAM, that can run at much higher clock speeds than conventional memory so as to effectively double transfer rate. SDRAM is volatile and so must be constantly energized and refreshed, typically 1,000 times per second. SDRAM cells operate in a manner analogous to capacitors whose charge produces a voltage that is indicative of a logic level to be associated with the cell. The storage capacity of SDRAM may be increased in accordance with the invention by using the voltage on each cell of the memory as an ordered parameter. Thus consider the simple case of two bits of SDRAM and suppose that a logic "1" bit is represented by any voltage that exceeds $V_{REF}$. In such case, providing the memory cells are refreshed before the voltage of a cell whose logic level is to be construed as "1" does not fall below $V_{REF}$, the data integrity of the cell will be maintained. However, since the actual voltage of the cell is immaterial (providing only that it is greater than $V_{REF}$ for logic "1") it is not necessary to refresh different cells at different times so as to associate a different temporal order with the cells that may then be used to provide additional bits of data storage. Rather, instead of refreshing cells with a constant voltage at different times, cells may be refreshed simultaneously but with varying voltages whose gradient may be construed as a time-ordered sequence.

Figure 2:
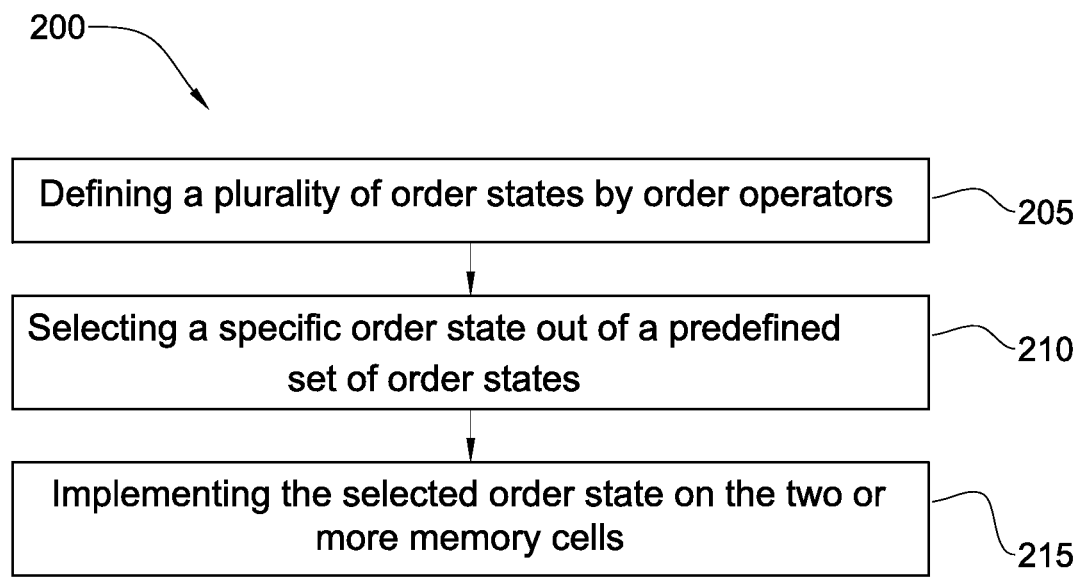
FIG. 2 is a schematic a flow-chart 200 of a method for storing data on two or more memory cells, according to an embodiment of the present invention.

Moreover, it will be understood that in such an application the apparent "order" associated with different cells in the memory device is generated when writing the data to the cells (e.g., at step 215 in FIG. 2) but is actually derived when the data is read, at step 120 in FIG. 1. This is generally true whenever the order is not determined explicitly but is derived, at step 115 in FIG. 1 from the values of respective physical properties associated with different cells in the memory device.

In the following we will mention some non-limiting physical properties that may be used to define the Order feature associated with data in the storage cells:

1. Directional Potential Differences.
2. Directional Charge Current.

3. Time Voltage Decaying and/or Time Charge decaying.
4. Aging
5. Magnetic intensity
6. Optical intensity
7. Electromagnetic frequency.

As distinct from hitherto-proposed memory storage methods, the method according to the invention makes use of not only on "global" voltage reference values, but on relative values in between a set of bits.

The relative values provide the extra information, which is equivalent to extra bits.

The order in which data is written adds the dimension of time to the storage device whose physical cells define the dimension of space. Thus, the invention allows data to be stored in space-time rather than space only as provided for in known memory devices and storage methods.

The relativity of the physical values in between bits enables us to be more flexible, since the relative value of the observables, is the extra source of information. Therefore, GT—Greater Than, LT—Less Than, Eq—(almost) Equal, i.e. comparator operations (of step 110 in FIG. 1) are the needed operations for extracting the extra information.

The cost in the Space-Time storage method according to the invention is that more operations must be performed before the data is extracted or stored. However, the benefit is that more data can be stored. So while the total time delay might be increased, in practice it is much less than what might be expected.

Another cost might be due to the fact that the relative values of the bits should be preserved. So if the method of the invention is implemented in e.g. DDR, at step 215 in FIG. 2, the process for refreshing values should maintain not only the absolute values of the storage cell, but also the relative values (or relative comparative relation) in between the bits, which serve to associate an apparent order with the cells. This is a more complicated process, although the cost benefits are the additional storage capacity.

It is to be understood that the method for increasing storage capacity of a memory device is applicable to any memory device for which a physical property may be associated with the storage cells thereof such that discrete variations in the physical property may serve to associate an apparent order in writing data to at least some of the storage cells in the memory device. The invention therefore embraces any such memory device that is configured for applying the method. Thus, the invention may be employed in any of the following memory devices, among others: RAM, DRAM, SRAM, SDRAM, DDR-I, DDR-II, DDR-III, RDRAM, FLASH, FCRAM, MRAM, Optic memory, CD, DVD, ROM, PROM, EPROM, E$^2$PROM.

It will also be appreciated that such memory devices may themselves be part of composite processing units and devices such as CPU, GPU, DSP, FPGA, ASIC, FPGA, Network processor, A/D chips, D/A chips, Video chips, Voices chips, Logic devices, SD Card, Compact Flash, Smart-Media, PC-Card, Disk-On-Key, Dimm, Sim, PC, Mobile Phone, PDA, Remote Controller.

The invention claimed is:

1. A method of retrieving data from two or more memory cells, said method comprising:
    comparing in-between two or more different memory cells a value of a predefined physical property on each one of the two or more memory cells, said two or more different memory cells constituting a group of memory cells that is at least one among a plurality of groups of memory cells, and wherein said comparing is performed in-between said two or more memory cells of said group;
    determining an order state associated with the values of the predefined physical property on each of the respective two or more different memory cells to be one order state out of a predefined set of order states, and wherein the order states in the predefined set are defined by order operators selected from a group consisting of: $<, >, =, \neq, \leq, \geq, \approx$; and
    deriving readable information based on the determined order state.

2. The method according to claim 1, wherein each one of the plurality of groups of memory cells comprises a predefined number N of physical bits.

3. The method according to claim 1, wherein the number of memory cells in each one of the plurality of groups of memory cells is not fixed.

4. The method according to claim 1, further comprising comparing, for each memory cell in the group of memory cells, between a value of a physical property on the memory cell and a respective external reference value.

5. The method according to claim 4, further comprising deriving additional readable information from each one of the two or more memory cells based on the comparison with the external reference value.

6. The method according to claim 4, wherein the physical property with which the external reference value corresponds is different than the predefined physical property compared in-between the two or more different memory cells.

7. The method according to claim 4, wherein the physical property with which the external reference value corresponds is the same as the predefined physical property compared in-between the two or more different memory cells.

8. The method according to claim 1, further comprising comparing in-between two or more different memory cells values of more than one predefined physical property on each one of the two or more memory cells, wherein said comparing is performed in-between said two or more memory cells of the group of memory cells with regard to each of the more than one predefined physical property.

9. The method according to claim 8, further comprising determining an order state associated with the values of the more than one predefined physical property on each of the respective two or more different memory cells to be one order state out of a predefined set of order states.

10. The method according to claim 1, further comprising obtaining a group of three different memory cells each one of the three memory cells in the group is adapted to be at one out of three predefined possible values of the predefined physical property.

11. The method according to claim 10, further comprising obtaining an external reference value corresponding to the predefined physical property, the external reference value is less than any of the differences between the three possible values of the memory cells.

12. The method according to claim 11, wherein the external reference value is in-between the lower values out of the three possible values of the memory cells.

13. The method according to claim 12, wherein the comparing comprises determining an order operator among each memory cell and each other memory cell in the group to be one of: ">" or "<", and said comparing further comprises determining a difference value in-between each one of the three cells in the group and each other cell in the group, and wherein in case the difference value is less than the external reference value, determining the order operator in-between each the respective memory cells to be "=".

14. The method according to claim 13, wherein the comparing further comprises comparing any of the lower values of the two or three memory cells to the external reference to be one of the following: ">ref" or "<ref".

15. The method according to claim 14, further comprising selecting 16 order states out-off all possible order states for the group of memory cells, wherein the possible order states for a group of three different memory cells comprise the following:

{[a>b>c], [a>c>b], [b>a>c], [b>c>a], [c>a>b], [c>b>a]},
{[a>b=c>ref], [b=c>a>ref], [b>a=c>ref], [a=c>b>ref], [c>a=b>ref], [a=b>c>ref], [a=b=c>ref]},
{[a>b=c<ref], [b=c>a<ref], [b>a=c<ref], [a=c>b<ref], [c>a=b<ref], [a=b>c<ref], [a=b=c<ref],}.

16. The method according to claim 1, further comprising deriving a four-bit binary value based on the determined order state.

17. The method according to claim 1, further comprising obtaining a group of four different memory cells each one of the four memory cells in the group is adapted to be at one out of four predefined possible values of the predefined physical property.

18. The method according to claim 17, further comprising obtaining an external reference value corresponding to the predefined physical property, the external reference value is less than any of the differences between the four possible values of the memory cells.

19. The method according to claim 18, wherein said comparing comprises determining an order operator among each memory cell and each other memory cell in the group to be one of: ">" or "<", and said comparing further comprises determining a difference value in-between each one of the four cells in the group and each other cell in the group, and wherein in case the difference value is less than the external reference value determining the order operator in-between each the respective memory cells to be "=".

20. The method according to claim 19, wherein selecting 64 order states out-off all possible order states for the group of memory cells, wherein the possible order states for a group of four different memory cells comprise the following:

{[a>b>c>d], [a>b>d>c], [a>c>b>d], [a>c>d>b], [a>d>b>c], [a>d>c>b], [b>a>c>d], [b>a>d>c], [b>c>a>d], [b>c>d>a], [b>d>a>c], [b>d>c>a], [c>a>b>d], [c>a>d>b], [a>b>a>d], [c>b>d>a], [c>d>a>b], [c>d>b>a], [d>a>b>c], [d>a>c>b], [d>b>a>c], [d>b>c>a], [d>c>a>b], [d>c>b>a]},

{[a=b>c>d], [a=b>d>c], [c>a=b>d], [c>d>a=b], [d>a=b>c], [d>c>a=b], [a=c>b>d], [a=c>d>b], [b>a=c>d], [b>d>a=c], [d>a=c>b], [d>b>a=c], [a=d>b>c], [a=d>c>b], [b>a=d>c], [b>c>a=d], [c>a=d>b], [c>b>a=d], [b=c>a>d], [b=c>d>a], [a>b=c>d], [a>d>b=c], [d>b=c>a], [d>a>b=c], [b=d>a>c], [b=d>c>a], [a>b=d>c], [a>c>b=d], [c>b=d>a], [c>a>b=d], [c=d>a>b], [c=d>a>b], [a>c=d>b], [a>b>c=d], [b>c=d>a], [b>a>c=d], [a>b=c=d], [b=c=d>a], [b>a=c=d], [a=c=d>b], [c>a=b=d], [a=b=d>c], [d>a=b=c], [a=b=c>d], [a=b>c=d], [c=d>a=b], [a=c>b=d], [b=d>a=c], [a=d>b=c], [b=c>a=d], [a>b=c=d], [c=d>a>b], [a=c>b=d], [b=d>a>c], [a=d>b>c], [b=c>a>d], [a=b>c=d], [c=d>a=b], [a=c>b=d], [b=d>a=c], [a=d>b=c], [b=c>a=d], [a=d>b=c], [b=c>a=d], [a=b=c=d]}.

21. The method according to claim 20, further comprising determining an order state for the group of memory cells from among a predefined set of order states based on the order operators among each memory cell and each other memory cell in the group.

22. The method according to claim 21, further comprising deriving a 6 bit binary value based on the determined order state.

23. The method according to claim 1, further comprising obtaining a group of n different memory cells, wherein a predefined physical property on each one of the n memory cells has a different value, giving rise to n distinct values of said predefined physical property.

24. The method according to claim 23, wherein the comparing comprises determining the value of the predefined physical property in-between each memory cell in the group and each other memory cell to be either ">" or "<", giving rise to an order state out of a predefined set of order states, the set of order states consisting of n! possible order states for the group of memory cells.

25. The method according to claim 24, further comprising selecting 2Int[log 2(n!)] out of the n! possible order states.

26. The method according to claim 25, further comprising deriving a Int[log 2(n!)] binary value based on the determined order state.

27. The method according to claim 1, wherein the value of a predefined physical property is selected from a group comprising one or more of the following: electric charge, current, voltage, directional potential differences, directional charge current, time voltage decaying, time charge decaying, aging, magnetic intensity, optical intensity, electromagnetic frequency.

28. The method according to claim 1, further comprising storing data on two or more memory cells.

29. A method of storing data on two or more memory cells, said method comprising:
   selecting a specific order state out of a predefined set of order states, the specific order state representing a respective order among values of a predefined physical property, and wherein the order states in said predefined set are defined by the order operators, selected from a group consisting of: <, >, =, ≠, ≦, ≧, ≈; and
   implementing the selected order state on the two or more memory cells, so that a relation in-between the two or more memory cells of a value of the predefined physical property on each one of the two or more memory cells complies with the selected order state, giving rise to retrievable readable information that is based on the selected order state.

30. A memory device having at least two storage cells and being configured to perform the method according to claim 1.

31. A memory device having at least two storage cells and being configured to perform the method according to claim 29.

32. The memory device according to claim 30, being in the group: RAM, DRAM, SRAM, SDRAM, DDR, DDR-I, DDR-II, DDR-III, RDRAM, FLASH, FCRAM, MRAM, Optic memory, CD, DVD, ROM, PROM, EPROM, E2PROM.

33. The memory device according to claim 31, being in the group: RAM, DRAM, SRAM, SDRAM, DDR, DDR-I, DDR-II, DDR-III, RDRAM, FLASH, FCRAM, MRAM, Optic memory, CD, DVD, ROM, PROM, EPROM, E2PROM.

34. An electronic device containing the memory device according to claim 30.

35. An electronic device containing the memory device according to claim 31.

36. A hardware assembly containing one of the memory device and electronic device according to claim 34.

37. A hardware assembly containing one of the memory device and electronic device according to claim 35.

* * * * *